United States Patent
Yao et al.

(10) Patent No.: US 7,968,867 B2
(45) Date of Patent: Jun. 28, 2011

(54) LIGHT-EMITTING DEVICE AND METHOD FOR MANUFACTURING THE SAME

(75) Inventors: Chiu-Lin Yao, Hsinchu (TW); Ta-Cheng Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 62 days.

(21) Appl. No.: 12/453,183

(22) Filed: May 1, 2009

(65) Prior Publication Data
US 2009/0272964 A1 Nov. 5, 2009

(30) Foreign Application Priority Data
May 2, 2008 (TW) .............................. 97116548 A

(51) Int. Cl.
*H01L 33/00* (2010.01)
(52) U.S. Cl. ...... 257/14; 257/98; 257/103; 257/E33.008
(58) Field of Classification Search .................... 257/14, 257/94, 103, E33.003, E33.008, 98
See application file for complete search history.

(56) References Cited

U.S. PATENT DOCUMENTS

| 7,206,488 B1* | 4/2007 | Altug et al. | 385/131 |
| 2006/0284187 A1* | 12/2006 | Wierer et al. | 257/79 |
| 2007/0172183 A1* | 7/2007 | Wang | 385/125 |

FOREIGN PATENT DOCUMENTS

| CN | 1877872 | 12/2006 |
| JP | 2008-53134 A | 3/2008 |

* cited by examiner

*Primary Examiner* — Minh-Loan T Tran
(74) *Attorney, Agent, or Firm* — Bacon & Thomas, PLLC

(57) ABSTRACT

A light-emitting device and the method for making the same is disclosed. The light-emitting device is a semiconductor device, comprising a growth substrate, an n-type semiconductor layer, a quantum well active layer and a p-type semiconductor layer. It combines the holographic and the quantum well interdiffusion (QWI) to form a photonic crystal light-emitting device having a dielectric constant of two-dimensional periodic variation or a material composition of two-dimensional periodic variation in the quantum well active layer. The photonic crystal light-emitting devices can enhance the internal efficiency and light extraction efficiency.

12 Claims, 6 Drawing Sheets

LIGHT-EMITTING DEVICE AND METHOD FOR MANUFACTURING THE SAME

BACKGROUND

1. Technical Field

A light-emitting device and the method for making the same are disclosed.

2. Reference to Related Application

This application claims the right of priority based on TW application Ser. No. 097116548, filed May 2, 2008, entitled "LIGHT-EMITTING DEVICE AND METHOD FOR MANUFACTURING THE SAME", and the contents of which are incorporated herein by reference.

3. Description of the Related Art

Semiconductor light-emitting elements are wildly utilized in various applications, such as traffic lights, Blue-DVD of high density storage devices, green light RCLED (used in the internal communications and control system of the plastic optical fiber used in car) and medical devices (UV LEDs), etc. The increasing of light-emitting efficiency makes the application of the light-emitting elements spread extensively, such as optical display device (RGB edge-lit back light units) or rear-projection TV. Therefore, the main research topic is to increase efficiency of light-emitting element.

The light emitted from the light-emitting device is omni-directional. In the application of optical modules, the utilization efficiency of light is limited because of the influence of the etendue. Therefore, one method to increase the efficiency of the light-emitting device is to make the light emitted from the light-emitting device directionally and reduce the divergence angle. E. Yablonovitch and S. John presented a dielectric material periodically arranged in ½ order of wavelength of the radio waves in 1987 that the wavelength is from far ultrared rays to visible light (300-700 nm). The behaviors of the radio waves in the highly arranged material are similar to electrons in crystals affected by the spacial structure, the period of the arrangement, the structure type, and the dielectric constant of the dielectric materials. By designation of the order of optical wavelength and the photonic bandgap of the dielectric material without the need of changing the chemical structure of the dielectric material, a new artificial crystal element of different optical properties is called photonic crystal (PC) is introduced. When it is applied to light-emitting diode (LEDs), the surface of the LED is etched to form a patterned structure of two-dimensional photonic crystal to restrain the light emitted randomly from the LED and increase the light emitting upwardly, so the divergence angle is decreased and the light efficiency is improved.

The material composition of the photonic crystals has periodic variations in the x-y space, and the planal observation of the structure in two-dimensional equivalent refractive index is shown in FIG. 1. The equivalent refractive index of the structure is represented two-dimensionally wherein $n_1$ represent the refractive index after the interdiffusion of the quantum well and $n_2$ represent the refractive index before the interdiffusion of the quantum well. The refractive index difference $(n_1-n_2)$ is defined as $\Delta n$, $\Delta n=n_r+j*n_i$ (1-1), wherein $n_r$ represents the real unit of the refractive index difference and $n_i$ represents the imaginary unit of the refractive index difference. The material composition of the active layer is periodically varied, and the parameters of $n_r$ and $n_i$ coexist where $n_r$ influences the light extraction efficiency and $n_i$ influences the internal efficiency of LED. A conventional method is to etch two-dimensional photonic crystals on the surface of the LED to form a two-dimensional equivalent refractive index plane wherein the $\Delta n$ has $n_r$ only ($n_i$ is zero) so as to influence the light extraction efficiency and the divergence angle of the LED.

Another conventional method is using the laser holography apparatus and the semiconductor processes like photography, development and etching to form nano-sized islands on the ohmic contact layer of the LED to increase the light extraction efficiency.

SUMMARY

A light-emitting device having a photonic crystal structure is disclosed. Taking light-emitting diode as an example, the material of the active layer has a periodic variation in the x-y space to increase the internal efficiency and the light extraction efficiency. In addition, the periodic variation of the refractive index is in the active layer but not in the surface of the light-emitting diode. Based on the distribution of the photons, the photonic crystal light-emitting diode needs a slight adjustment of the refractive index to efficiently increase the internal efficiency and the light extraction efficiency.

BRIEF DESCRIPTION OF THE DRAWINGS

The accompanying drawings are included to provide easy understanding of the invention, and are incorporated herein and constitute a part of this specification. The drawings illustrate embodiments of the invention and, together with the description, serve to illustrate the principles of the invention.

DESCRIPTION OF THE PREFERRED EMBODIMENTS

Figure 1:
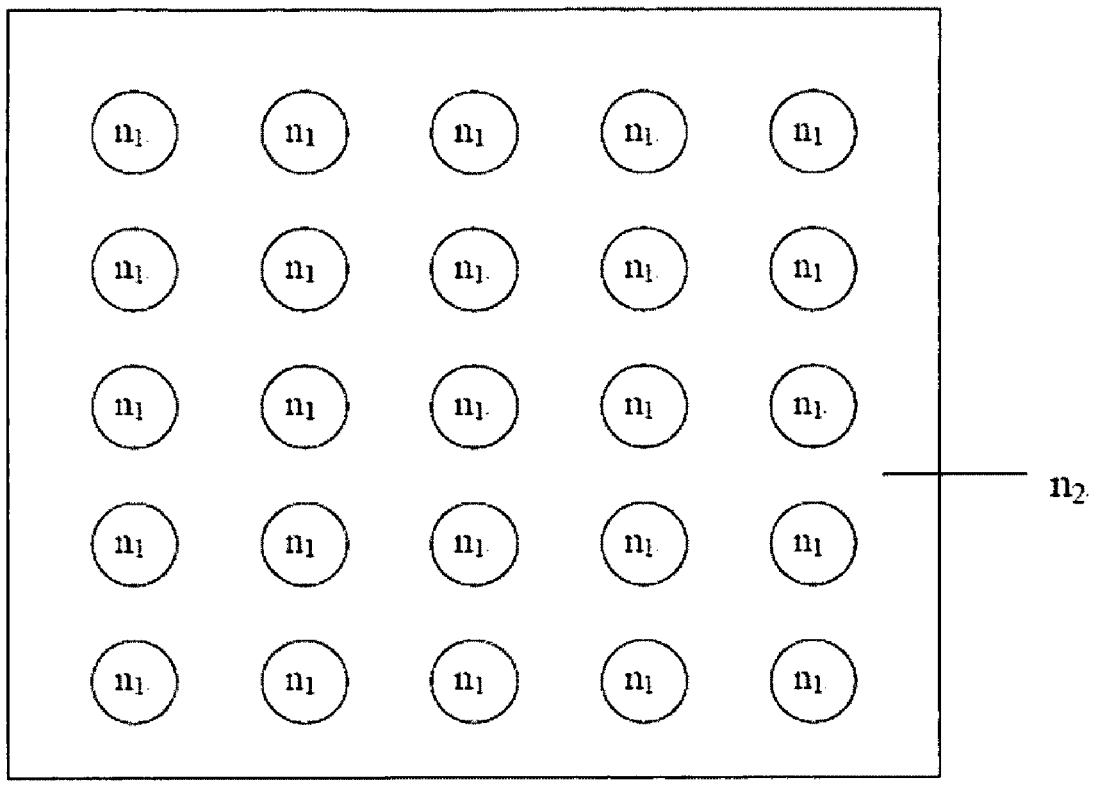
FIG. 1 illustrates the material composition of the gain region of the light-emitting diodes having a periodic variation in the x-y space.

Reference is made in detail to the preferred embodiments of the present invention, examples of which are illustrated in the accompanying drawings. Wherever possible, the same reference numbers are used in the drawings and the description to refer to the same or like parts.

Figure 2:
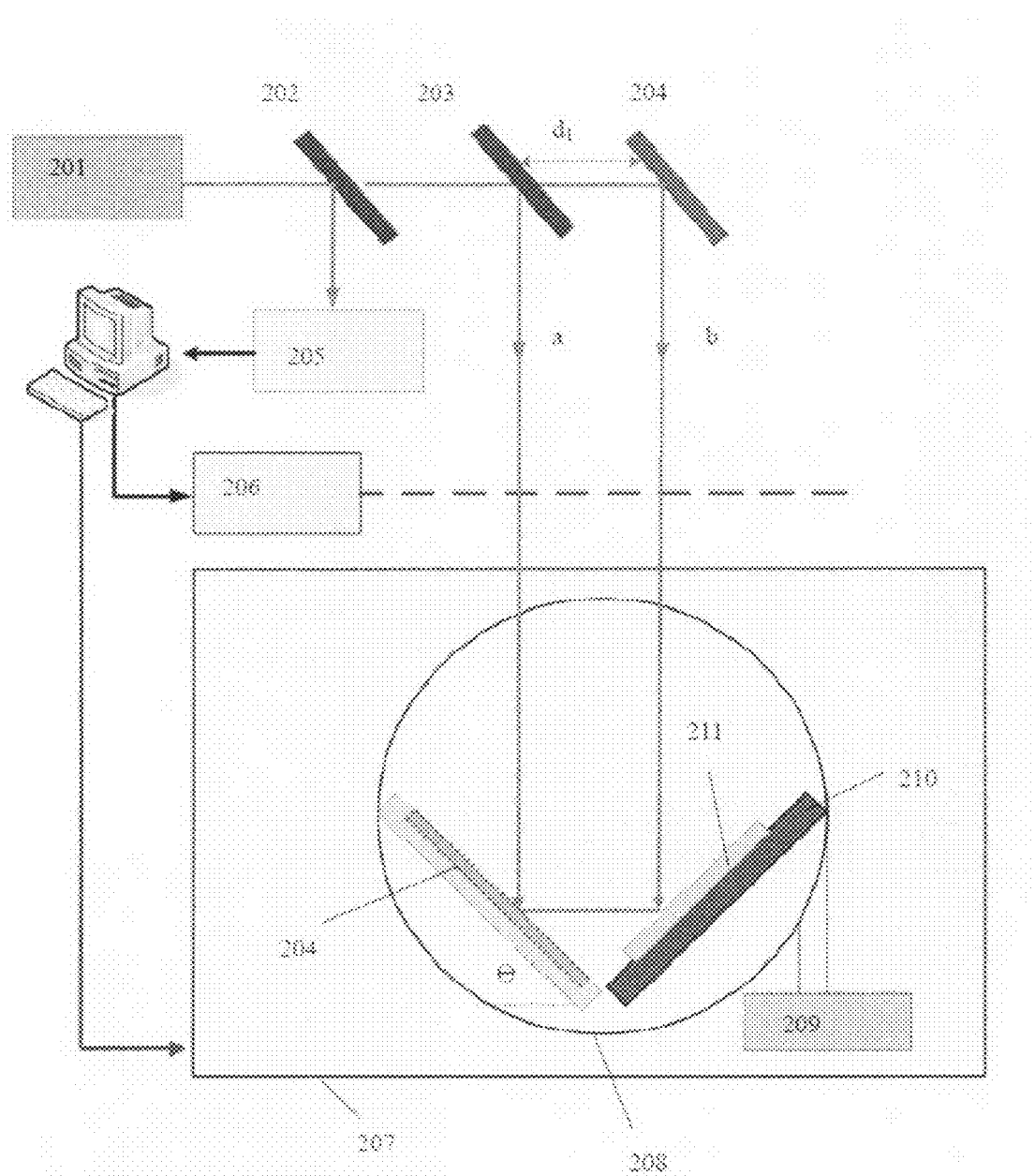
FIG. 2 illustrates the structure of the new holographic system of the present invention.
Figure 3:
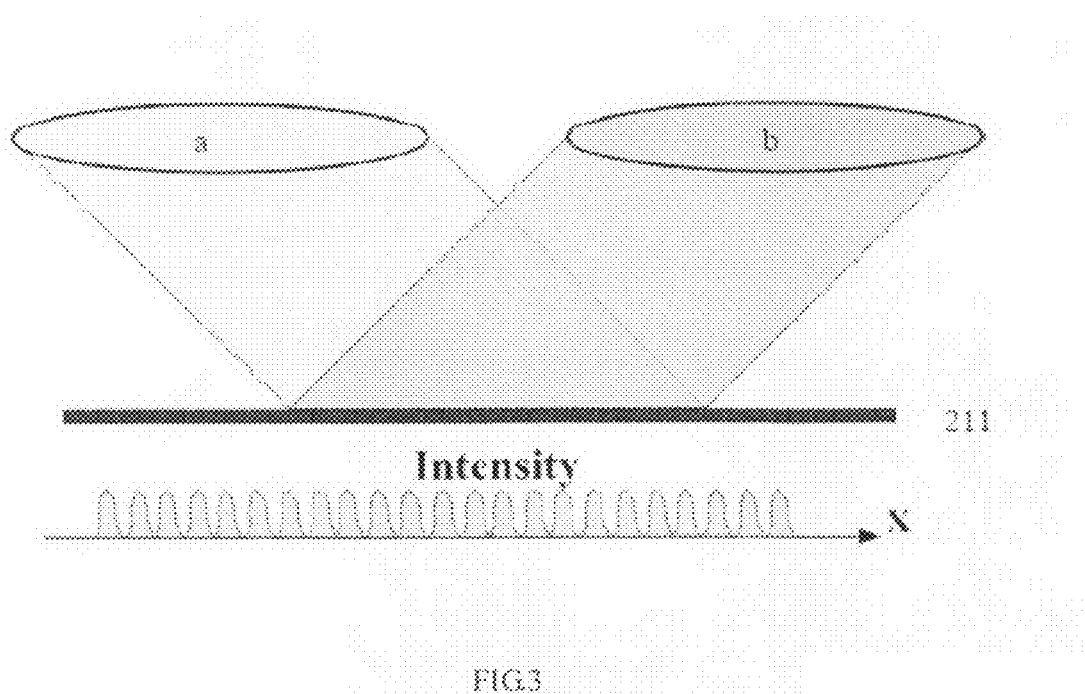
FIG. 3 illustrates the effect of the partial quantum mixed states induced by the incident light in one embodiment of the present invention.

In order to avoid damaging the active layer of the epitaxial structure caused by the etching process, a new holographic system used in the present invention is illustrated in FIG. 2. In the system, an 1:1 splitter 203 replaces a conventional beam expander, and a wafer gripper swivel device 208 is set on a precise X-Y motion controller 207. Two incident lights having light path difference a and b are formed a one-dimensional periodic luminous intensity distribution on the surface of the wafer for manufacturing light-emitting diodes as illustrated in FIG. 3. The period of the luminous intensity Λ can be decided by the formula 1-2 wherein the $\lambda_{laser}$ is the laser wavelength, $d_1$ is the distance from 1:1 splitter to 100% ultra-violent mirror 204, n is the light path difference factor due to the splitter, m is the interference order of the two lights wherein n and m is integer.

$$\lambda_{Laser}=2\ m[(d_1/\lambda_{Laser})-n-\Lambda \cos \theta] \quad (1\text{-}2)$$

Before manufacturing, the interference streak of the two incident lights is recorded on the photoresist (θ is fixed and m equal to 1), and the interference period Λ is measured by AFM to reverse conduct the light path difference factor n. The period Λ is decided by changing the angle θ by the rotator A 209 wherein the angle θ is between 20-80 degree.

Figure 4:
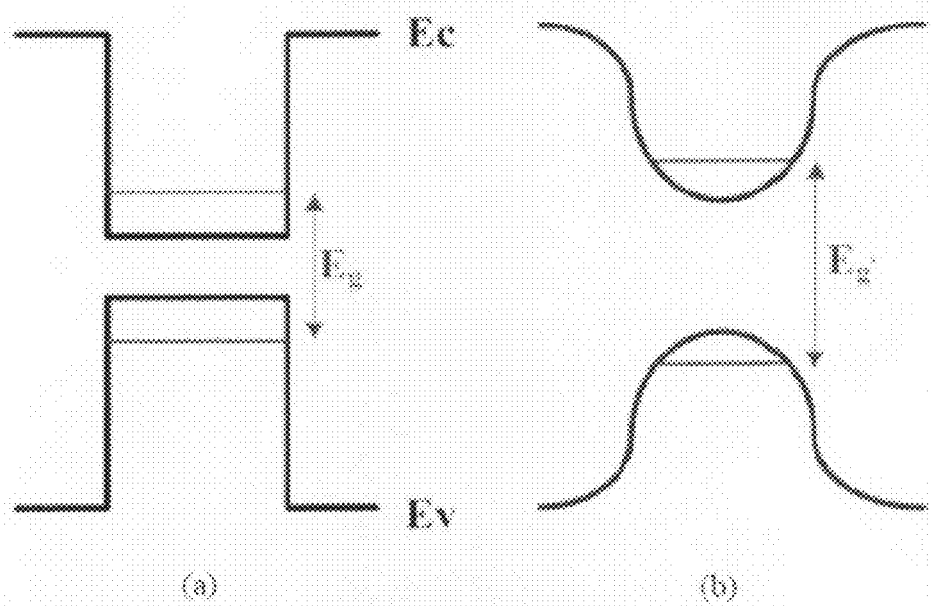
FIG. 4 illustrates the bandgap distribution diagram before and after the interdiffusion of the quantum well.
Figure 5:
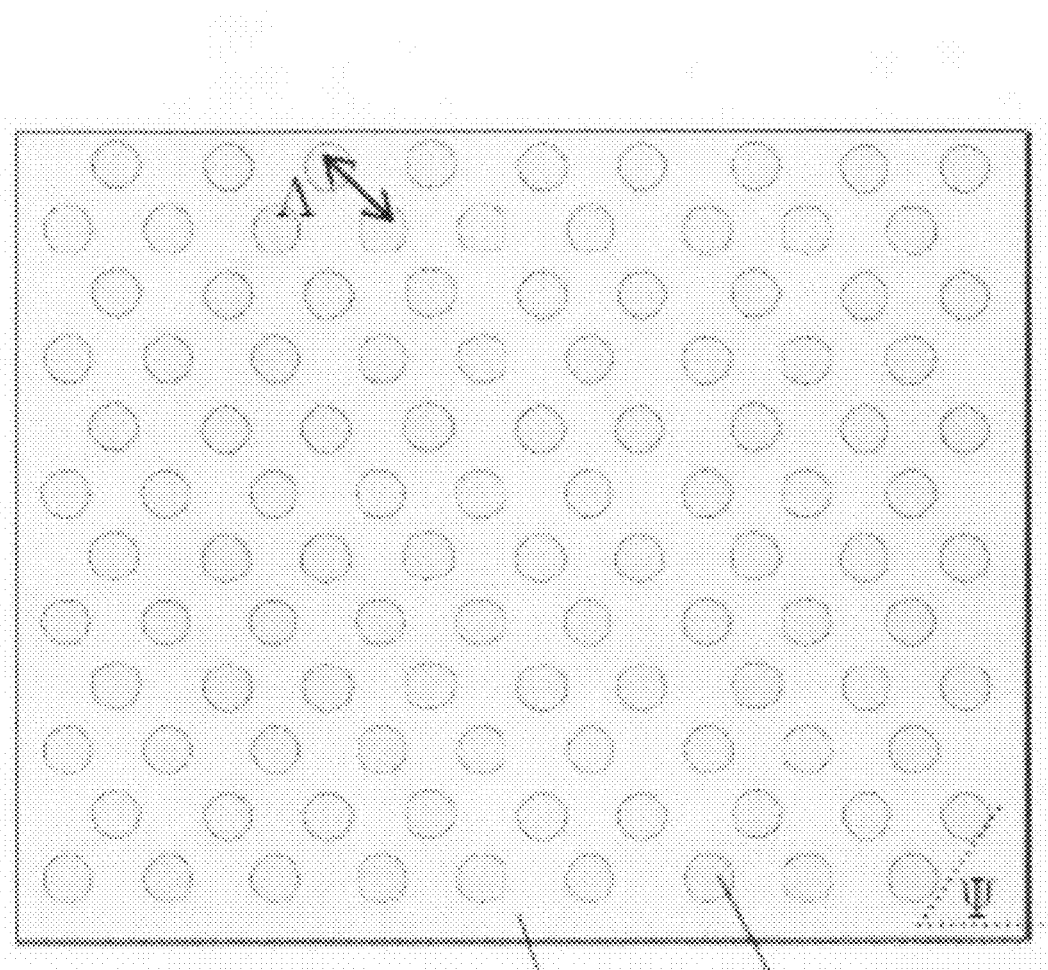
FIG. 5 illustrates the distribution of the field intensity in accordance with one embodiment of the present invention.
Figure 6:
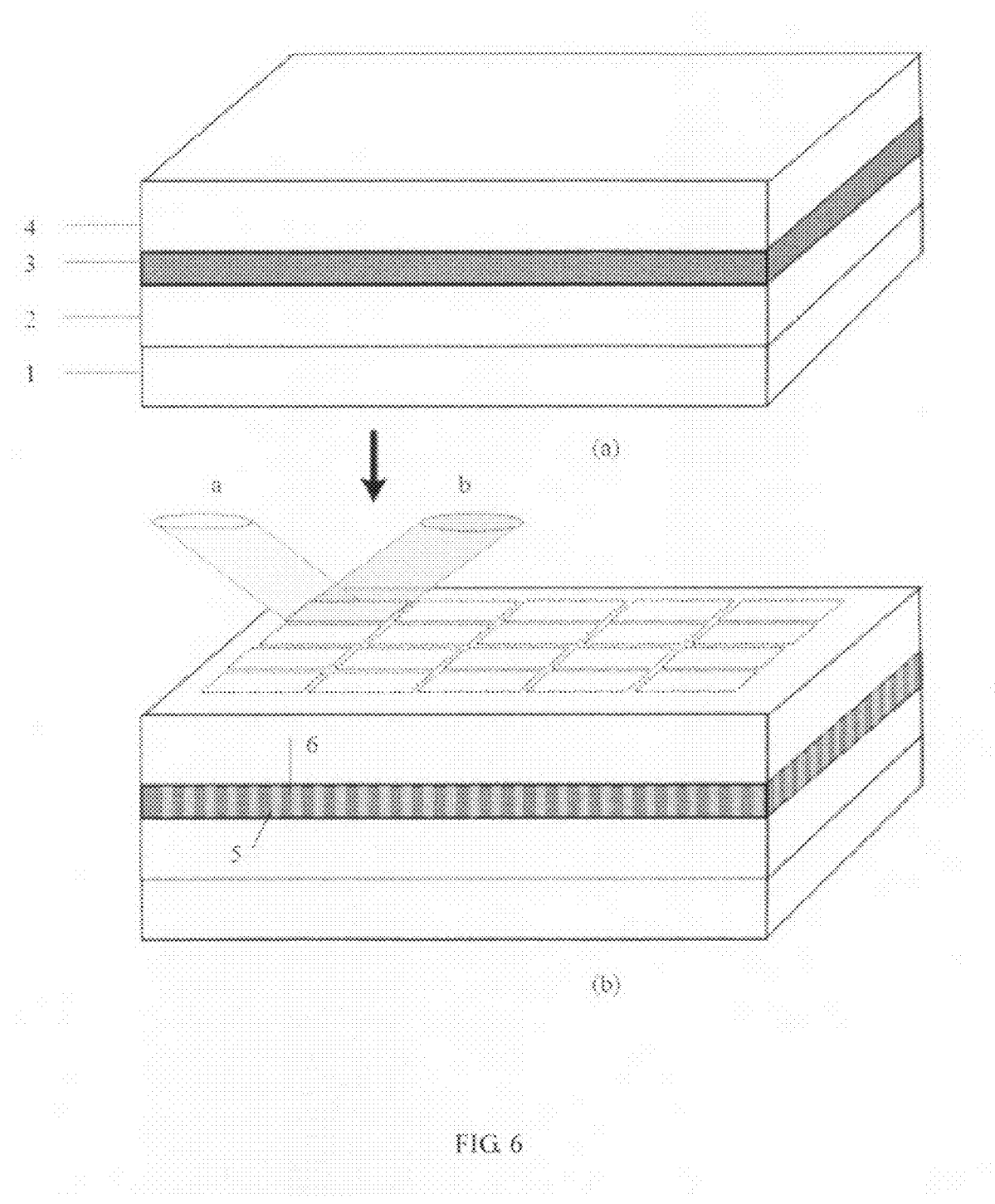
FIG. 6(a) illustrates the epitaxial structure of the light-emitting diode and 6(b) illustrates the photonic crystal light-emitting diode in accordance with one embodiment of the present invention.
Figure 7:
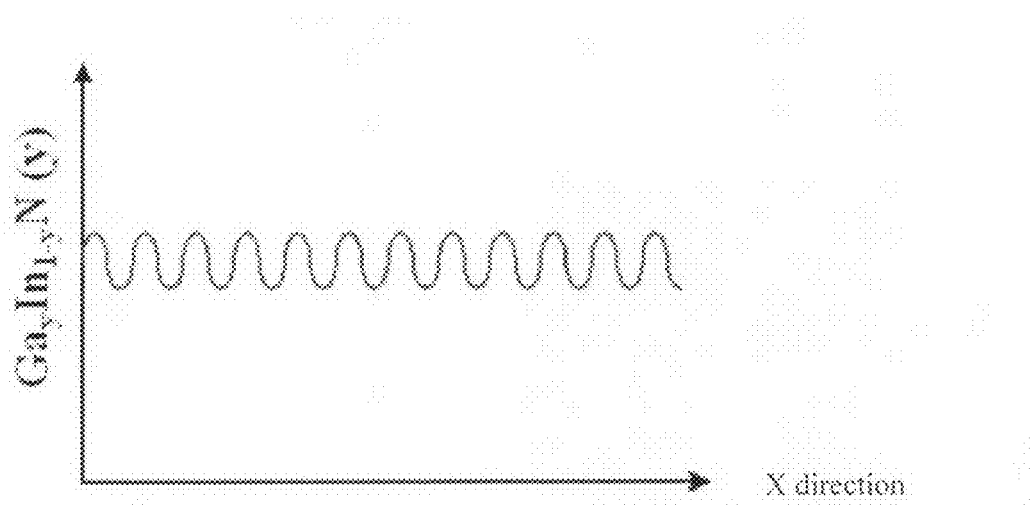
FIG. 7 illustrates the distribution of the active layer material composition of the light-emitting diode in the x axis in accordance with one embodiment of the present invention.

The interference of the two incident lights as described in the present invention can reach a variation in the luminous intensity of a period of 200-1000 nm. By adjusting the luminous intensity and the period of the incident lights, the difference of the bandgap and the refraction index is controlled. When the incident light passes through the confinement layer of the optoelectronics element and is absorbed by the quantum well, the temperature of part of the quantum well is increased rapidly and causes the atoms unstable after absorbing the heat. When the atoms absorb too much heat, the covalent bonds between atoms are broken, and the atoms diffuse to the region with lower concentration; the effect is called the quantum well interdiffusion (QWI). Generally, the energy band diagram of the quantum well in the active layer is shaped in rectangular well as shown in FIG. 4(a). After the quantum well interdiffusion happened, the energy band diagram of the quantum well is shaped in smooth arc as shown in FIG. 4(b) and the difference of the bandgap $E_g'$ becomes larger. The wavelength of the emitted light shifts to the short wavelength region and the refraction index becomes smaller. The interference of the two incident lights introduces a one-dimensional and orderly periodic luminous intensity distribution. When forming a two-dimensional photonic crystal, the interference process is performed twice. The included angle Ψ (between 20-90 degree) between the two quantum well interdiffusions can be determined by the rotator B 210 shown in FIG. 2. By adjusting the luminous intensity, the energy bandgap difference is larger in the region where the quantum well interdiffusions are overlapped as indicated in the c region in FIG. 5, so as to have variation in the refraction index. The variation has the two-dimensional period and the periods for each dimension of the two dimensions are different. With the method of forming the light-emitting diode having two-dimensional photonic crystal, the time difference between the two interferences should be adjusted to avoid a prolonged time difference to decrease the temperature and affect the quantum well interdiffusion effect thereby. Besides, the effect of the quantum well interdiffusion can be increased by increasing the temperature of the carrier of the light-emitting diode chip. In general, the laser beams has a diameter of 1 mm so the effective area for quantum well interdiffusion effect is limited. Therefore, in another embodiment, the wafer gripper swivel device 208 set on the precise X-Y motion controller 207 acts as stepper for manufacturing a photonic crystal light-emitting diode having a larger area as shown in FIG. 6(b). FIG. 7 shows the distribution of the active layer material composition of the light-emitting device (y) along the x axis after one quantum well interdiffusion. Because the distribution of the light energy is varied periodically and gradually in the x-y space, the material composition of the active layer also varies periodically and gradually in the x-y space after the two quantum well interdiffusions, and the optical confinement and the current confinement of the light-emitting diode are improved accordingly. Such variation of the material composition of the active layer can embody in the changes of the dielectric constant of the material composition of the active layer.

Embodiment 1

Figure 8:
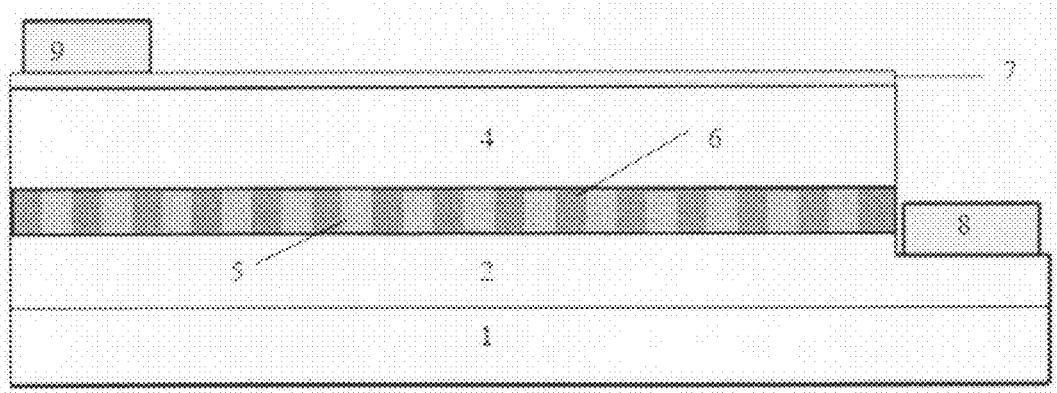
FIG. 8 is a schematic illustration of lateral view of the photonic crystal light-emitting diode in accordance with one embodiment of the present invention.

Referring to FIG. 6(a), a growth substrate 1 such as GaAs, silicon, SiC, $Al_2O_3$, InP, GaP, AlN or GaN is provided and is not limited to transparent substrate or light absorption substrate. An n-type semiconductor layer 2 such as n-GaN or n-AlGaInP, a multi-quantum well active layer 3 such as InGaN or AlGaInP, and a p-type semiconductor layer 4 such as p-GaN or p-AlGaInP is sequentially epitaxially grown by metal-organic chemical vapor deposition (MOCVD) process to form an epitaxial structure of a light-emitting diode wherein the n-type semiconductor layer or the p-type semiconductor layer can be a confinement layer. The two incident lights are emitted to the surface of the whole light-emitting diode structure to form interference streak by the new holographic system illustrated in FIG. 2. When the laser wavelength is between the corresponding wavelength of the confinement layer 4 (the p-type semiconductor layer) and the multi-quantum well active layer 3 ($\lambda_{cladding}<\lambda_{laser}<\lambda_{QW}$), the incident lights passing through the confinement layer (the p-type semiconductor layer) are absorbed by the multi-quantum well active layer, and the temperature of part of quantum well is increased rapidly so the atoms of the composition become unstable because of the heat. When the atoms absorb too much heat, the covalent bonds between atoms are broken, and the atoms diffuse to the lower concentration region and cause the quantum well interdiffusion. The interference of the two incident lights can reach a variation of the luminous intensity with a period of 200-1000 nm. By adjusting the luminous intensity and the time period of the incident lights, the different variation of the bandgap and the refraction index is controlled. The included angle Ψ (between 20-90 degree) between the two quantum well interdiffusions can be decided by the rotator B. The luminous intensity is also controlled to have a larger energy bandgap difference in the overlapped quantum well interdiffusion region (the crossover region) to alter the refraction index. The variation has a two-dimensional period to form a photonic crystal light-emitting diode as shown in FIG. 6(b) wherein the two periods are not necessary to be the same. A current spreading layer 7 is formed on the p-type semiconductor layer and is etched downward to the n-type semiconductor layer. A p-type electrode 9 is formed on the current spreading layer 7 and an n-type electrode 8 is formed on the n-type semiconductor layer respectively to form a photonic crystal light-emitting diode as shown in FIG. 8.

Embodiment 2

Referring to FIG. 6(a), a growth substrate 1 such as GaAs, silicon, SiC, $Al_2O_3$, InP, GaP, AlN or GaN is provided and is not limited to transparent substrate or light absorption substrate. An n-type semiconductor layer 2 such as n-GaN or n-AlGaInP, a multi-quantum well active layer 3 such as InGaN or AlGaInP and a p-type semiconductor layer 4 such as p-GaN or p-AlGaInP is sequentially epitaxially grown by metal-organic chemical vapor deposition (MOCVD) process to form an epitaxial structure of a light-emitting diode wherein the n-type semiconductor layer or the p-type semiconductor layer forms a confinement layer. The two incident lights are emitted to the surface of the light-emitting diode structure to form interference streak by the new holographic system illustrated in FIG. 2. When the laser wavelength is smaller than the corresponding wavelength of the confinement layer 4 (the p-type semiconductor layer) ($\lambda_{laser}<\lambda_{cladding}$), the incident lights are absorbed by the surface of the confinement layer (the p-type semiconductor layer) to increase the temperature of the surface rapidly and the quantum well interdiffusion is occurred because of the heat diffusion. The interference of the two incident lights can reach a variation of the luminous intensity with a period of 200-1000 nm. By adjusting the luminous intensity and the time period of the incident lights, the different variation of the bandgap and the refraction index is controlled. The included angle Ψ (between 20-90 degree) between the two quantum well interdiffusions can be decided by the rotator B. The luminous intensity is also controlled to have a larger energy bandgap difference in the overlapped quantum well interdiffusion region (the crossover region) and so as to have variation in the refraction index. The variation has the two-dimensional period and the periods for each dimension of the two dimensions can be different to form a photonic crystal light-emitting diode as shown in FIG. 6(b). A current spreading layer 7 is formed on the p-type semiconductor layer. The current spreading layer 7 is etched down to the n-type semiconductor layer. A p-type electrode 9 is formed on the current spreading layer and an n-type electrode 8 is formed on the n-type semiconductor layer respectively to form a photonic crystal light-emitting diode as shown in FIG. 8.

Embodiment 3

Referring to FIG. 6(a), a growth substrate 1 such as GaAs, silicon, SiC, Al$_2$O$_3$, InP, GaP, AlN or GaN is provided and is not limited to transparent substrate or light absorption substrate. An n-type semiconductor layer 2 such as n-GaN or n-AlGaInP, a multi-quantum well active layer 3 such as InGaN or AlGaInP and a p-type semiconductor layer 4 such as p-GaN or p-AlGaInP is sequentially epitaxially grown by metal-organic chemical vapor deposition (MOCVD) process to form an epitaxial structure of a light-emitting diode wherein the n-type semiconductor layer or the p-type semiconductor layer forms a confinement layer. The two incident lights are emitted to the surface of the light-emitting diode structure to form interference streak by the new holographic system illustrated in FIG. 2. When the laser wavelength is smaller than the corresponding wavelength of the multi-quantum well active layer 3 ($\lambda_{laser}<\lambda_{QW}$), the interference of the two incident lights can reach a variation of the luminous intensity with a period of 200-1000 nm. By adjusting the luminous intensity and the time period of the incident lights, the different variation of the bandgap and the refraction index is controlled. The included angle Ψ (between 20-90 degree) between the two quantum well interdiffusions can be decided by the rotator B. The luminous intensity is also controlled to have a larger energy bandgap difference in the overlapped quantum well interdiffusion region (the crossover region) and so as to have variation in the refraction index. The variation has the two-dimensional period and the periods for each dimension of the two dimensions can be different to form a photonic crystal light-emitting diode as shown in FIG. 6(b). A current spreading layer 7 is formed on the p-type semiconductor layer. The current spreading layer 7 is etched down to the n-type semiconductor layer. A p-type electrode 9 is formed on the current spreading layer and an n-type electrode 8 is formed on the n-type semiconductor layer respectively to form a photonic crystal light-emitting diode as shown in FIG. 8.

What is claimed is:

1. A light-emitting device comprising:
a substrate; and
a semiconductor stack formed on the substrate wherein the semiconductor stack comprising a Ga$_y$In$_{1-y}$N quantum well active layer having a photonic crystal structure with a one or two-dimensional periodic variation of y in the material composition of the quantum well active layer.

2. The light-emitting device according to claim 1, wherein the one or two dimensional periodic variation varies the dielectric constant of the material composition of the quantum well active layer.

3. The light-emitting device according to claim 1, wherein the photonic crystal structure is processed on a holographic system and formed by two incident lights to form interference in the quantum well active layer.

4. The light-emitting device according to claim 3, wherein the laser wavelength of the holographic system is smaller than the wavelength of the light emitted from the quantum well active layer.

5. The light-emitting device according to claim 3, wherein the photonic crystal structure has a twice quantum well interdiffusions by the interference of two incident lights wherein the included angle is between 20-90 degree to form a two-dimensional photonic crystal.

6. The light-emitting device according to claim 1, wherein the semiconductor stack further comprising a first type conductivity semiconductor layer formed between the substrate and the quantum well active layer and a second type conductivity semiconductor layer formed on the quantum well active layer.

7. The light-emitting device according to claim 6, wherein the first type conductivity semiconductor layer or the second type conductivity semiconductor layer is a confinement layer.

8. The light-emitting device according to claim 6, wherein the photonic crystal structure is processed on a holographic system and formed by two incident lights to form interference in the quantum well active layer wherein the laser wavelength of the holographic system is smaller than the wavelength corresponding to the first or the second type conductivity semiconductor layer.

9. The light-emitting device according to claim 8, wherein the laser wavelength of the holographic system is between the wavelength corresponding to the first or second type conductivity semiconductor layer and the quantum well active layer.

10. The light-emitting device according to claim 1, wherein the substrate is a transparent substrate or a light absorbing substrate.

11. The light-emitting device according to claim 1, wherein the period of the one-dimensional periodic variation is 200-1000 nm.

12. The light-emitting device according to claim 1, wherein at least one of the periods of the two-dimensional periodic variation is 200-1000 nm and the periods of the two-dimensional periodic variation can be different.

* * * * *